United States Patent
Kim et al.

(10) Patent No.: US 11,296,670 B2
(45) Date of Patent: Apr. 5, 2022

(54) IMPEDANCE MATCHING TRANSCEIVER

(71) Applicant: QUALCOMM Incorporated, San Diego, CA (US)

(72) Inventors: Jonghae Kim, San Diego, CA (US); Milind Shah, San Diego, CA (US); Periannan Chidambaram, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 22 days.

(21) Appl. No.: 16/750,625

(22) Filed: Jan. 23, 2020

(65) Prior Publication Data
US 2021/0234526 A1 Jul. 29, 2021

(51) Int. Cl.
*H03H 7/38* (2006.01)
*H04B 1/40* (2015.01)
(Continued)

(52) U.S. Cl.
CPC .......... *H03H 7/383* (2013.01); *H01Q 1/2283* (2013.01); *H01Q 1/52* (2013.01); *H04B 1/40* (2013.01)

(58) Field of Classification Search
CPC .......... H04B 1/0458; H04B 1/18; H04B 1/40; H04B 17/12; H04B 1/44; H04B 1/48; H04B 1/406; H04B 7/0404; H04B 1/006; H04B 1/0064; H04B 5/0081; H04B 5/02; H04B 7/04; H04B 7/06; H04B 7/08; H04B 7/0805; H04B 7/0877; H04B 1/38; H01L 2223/6672; H01L 2223/6683; H01L 2225/0651; H01L 2225/06517;
(Continued)

(56) References Cited

U.S. PATENT DOCUMENTS 8,232,925 B2   7/2012   Knudsen et al.
8,369,390 B2 *  2/2013   Rofougaran ............ H01L 23/66
                                                         375/219
(Continued)

FOREIGN PATENT DOCUMENTS

EP      2610963 A1    7/2013
EP      3772183 A1 *  2/2021   ............... H04B 1/18
(Continued)

OTHER PUBLICATIONS

Alibakhshikenari, M. et al, An Innovative and Simple Impedance Matching Network Using Stacks of Metasurface Sheets to Suppress the Mismatch Between Antennas and RF Front-End Transceivers Circuits, Mar. 22, 2021, IEEE, 15th EuCAP 2021, doi: http://dx.doi.org/10.23919/EuCAP51087.2021 (Year: 2021).*
(Continued)

*Primary Examiner* — Lana N Le
(74) *Attorney, Agent, or Firm* — Muncy, Geissler, Olds & Lowe, P.C.

(57) ABSTRACT

Impedance matching transceivers may include a tuning circuit to match the transceiver module impedance to the housing conditions. In some examples, the impedance matching is controlled by tuning-circuits that may be integrated into a transceiver module by using a fan-out package (FO PKG). One example of a tuning circuit may include a switch to isolate the parallel capacitors, such that when the switch is on or closed the parallel capacitors are active.

20 Claims, 7 Drawing Sheets

(51) Int. Cl.
*H01Q 1/22* (2006.01)
*H01Q 1/52* (2006.01)

(58) Field of Classification Search
CPC ........... H01L 23/66; H01L 2224/16225; H01L 2223/6677; H01L 2224/33181; H01L 2225/06506; H01L 2924/15153; H01L 2924/1532; H01L 2924/19103; H01L 2924/19104; H01L 2223/6655; H01L 24/12; H01L 2224/24137; H01Q 1/52; H01Q 1/2283; H01Q 1/38; H03H 7/383
USPC .............. 455/91–355, 13.3, 78, 80, 81, 63.4
See application file for complete search history.

(56) References Cited

U.S. PATENT DOCUMENTS

| | | | | |
|---|---|---|---|---|
| 8,519,892 | B2* | 8/2013 | Ding | H01Q 1/2283 343/700 MS |
| 8,610,579 | B2* | 12/2013 | Rofougaran | H01L 23/66 340/572.7 |
| 8,928,536 | B2* | 1/2015 | Knudsen | H04B 1/0458 343/702 |
| 9,054,756 | B2* | 6/2015 | See | H04B 1/0458 |
| 9,391,370 | B2* | 7/2016 | Tzanidis | H01Q 9/0457 |
| 9,419,578 | B2 | 8/2016 | Leipold et al. | |
| 9,899,133 | B2 | 2/2018 | Maxim et al. | |
| 9,954,267 | B2 | 4/2018 | Yun et al. | |
| 10,951,248 | B1* | 3/2021 | Kamgaing | H03H 9/542 |
| 2002/0149535 | A1* | 10/2002 | Toncich | H01P 1/2056 343/860 |
| 2010/0114245 | A1 | 5/2010 | Yamamoto et al. | |
| 2011/0086600 | A1* | 4/2011 | Muhammad | H04B 1/00 455/120 |
| 2011/0102290 | A1* | 5/2011 | Milosavljevic | H01Q 9/145 343/852 |
| 2012/0295554 | A1* | 11/2012 | Greene | H01Q 1/50 455/77 |
| 2014/0194072 | A1* | 7/2014 | Mach | H04B 1/0458 455/73 |
| 2015/0200463 | A1* | 7/2015 | Heikura | H01Q 1/243 455/73 |
| 2017/0264322 | A1* | 9/2017 | Greene | H04B 1/40 455/13.3 |
| 2018/0315706 | A1 | 11/2018 | Liao et al. | |
| 2018/0332151 | A1* | 11/2018 | Kamgaing | H01Q 9/0414 |
| 2018/0350772 | A1 | 12/2018 | Nair et al. | |
| 2019/0027809 | A1* | 1/2019 | Judkins | H01Q 1/243 |
| 2019/0198980 | A1* | 6/2019 | Cong | H01Q 7/00 |
| 2019/0295972 | A1* | 9/2019 | Tsai | H01Q 1/2283 |

FOREIGN PATENT DOCUMENTS

| | | |
|---|---|---|
| KR | 20190013382 A | 2/2019 |
| KR | 20190120135 A | 10/2019 |
| WO | WO-2007074369 A1 * | 7/2007 ............... H01Q 1/48 |

OTHER PUBLICATIONS

International Search Report and Written—PCT/US2021/013076—ISA/EPO—dated May 6, 2021.

* cited by examiner

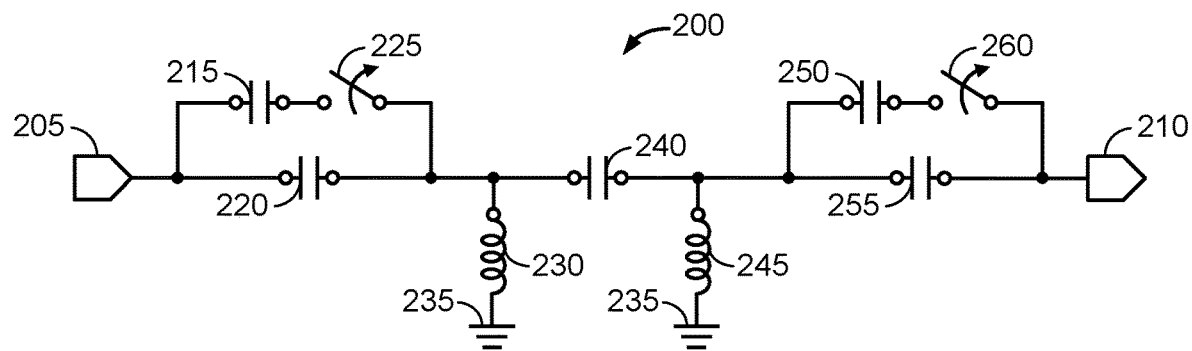
*FIG. 2A*
| Switch 225 | Switch 260 | Matching Freq. | |
|---|---|---|---|
| OFF | OFF | 3.25GHz | —265 |
| OFF | ON | 3.40GHz | —275 |
| ON | OFF | 3.55GHz | —280 |
| ON | ON | 3.75GHz | —270 |
*FIG. 2B*
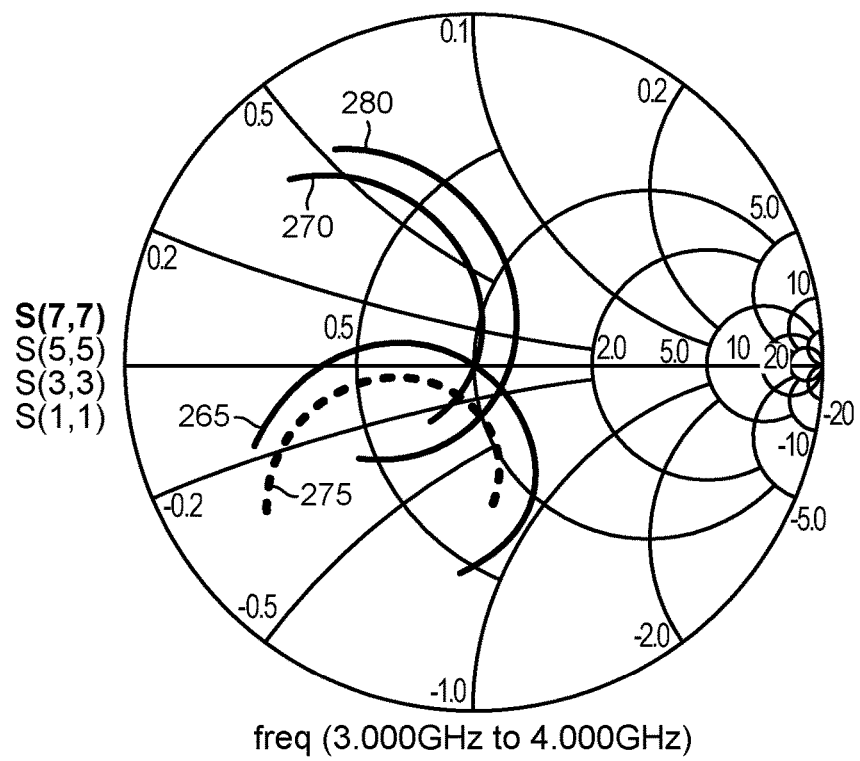
freq (3.000GHz to 4.000GHz)
*FIG. 2C*

IMPEDANCE MATCHING TRANSCEIVER

FIELD OF DISCLOSURE

This disclosure relates generally to transceivers, and more specifically, but not exclusively, to impedance matched transceivers.

BACKGROUND

As wireless devices become more prevalent, the need for more efficient transceivers increases. A transceiver module generally includes a receiver, a transmitter, and an antenna. Conventional transceiver modules are situated into a housing of the wireless device. The antenna impedance can vary significantly due to the housing environment (e.g., roughness, contact of module (e.g., touch), etc.). Thus, conventional transceiver modules generally have an impedance matching problem. As higher frequencies and more frequency options are being provided in transceiver modules, the impedance matching problem becomes more critical. Therefore, it is desired to minimize the impedance variation deficiency of conventional transceiver modules.

Accordingly, there is a need for systems, apparatus, and methods that overcome the deficiencies of conventional approaches including the methods, system and apparatus provided hereby.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In one aspect, a transceiver module comprises: an antenna substrate; a first antenna attached to a top surface of the antenna substrate; a second antenna attached to the top surface of the antenna substrate; a transceiver located proximate to a bottom surface of the antenna substrate opposite the top surface; a first radio frequency (RF) tuning circuit on a first side of the transceiver module, the first RF tuning circuit electrically coupled between the transceiver and the first antenna; and a second RF tuning circuit on a second side of the transceiver module opposite the first side, the second RF tuning circuit electrically coupled between the transceiver and the second antenna.

In another aspect, a transceiver module comprises: an antenna substrate; a first antenna attached to a top surface of the antenna substrate; a second antenna attached to the top surface of the antenna substrate; means for transmitting and receiving radio frequency signals located proximate to a bottom surface of the antenna substrate opposite the top surface; first means for tuning impedance on a first side of the transceiver module, the first means for tuning impedance electrically coupled between the means for transmitting and receiving radio frequency signals and the first antenna; and second means for tuning impedance on a second side of the transceiver module opposite the first side, the second means for tuning impedance electrically coupled between the means for transmitting and receiving radio frequency signals and the second antenna.

In still another aspect, a method for manufacturing a transceiver module comprises: providing an antenna substrate; attaching a first antenna attached to a top surface of the antenna substrate; attaching a second antenna attached to the top surface of the antenna substrate; providing a transceiver proximate to a bottom surface of the antenna substrate opposite the top surface; electrically coupling a first RF tuning circuit on a first side of the transceiver module between the transceiver and the first antenna; and electrically coupling a second RF tuning circuit on a second side of the transceiver module opposite the first side between the transceiver and the second antenna.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which:

FIGS. 2A-C illustrate another exemplary tuning circuit in accordance with some examples of the disclosure;

Figure 1A:
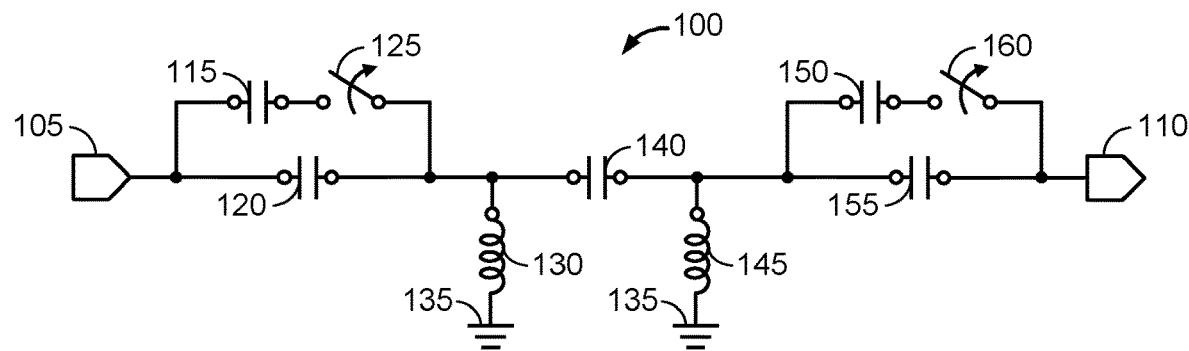
FIGS. 1A-C illustrate an exemplary tuning circuit in accordance with some examples of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein mitigate shortcomings of the conventional methods, apparatus, and systems, as well as other previously unidentified needs. For instance, examples herein include controlling the impedance-matching between an antenna and transceiver I/O pins with tuning circuitry, integrating the tuning circuit into the transceiver/antenna closely with a Fan Out (FO) package, and integrating a 3D inductor into the FO package by a Through Molding Via (TMV) for both high-Q and lower parasitic components. In some aspects, the impedance matching is controlled by tuning circuits. The tuning circuit can be integrated closely into transceiver/antenna by using a fan-out package (FO PKG), such that when the switches of the tuning circuit are off or open, the parallel capacitors are isolated. When the switches of the tuning circuit are on or closed the parallel capacitors are active. In another example, the tuning circuit includes independent switch 1 and switch 2 for isolating or connecting the corresponding parallel capacitors.

In another aspect, a fan-out package may include: a transceiver module (transceiver, antenna substrate, and antennas). The transceiver module has a first antenna (e.g., transmit TX) and a second antenna (receive RX) mounted on a top surface of the antenna substrate. The transceiver is adjacent the bottom surface of the antenna substrate. A first radio frequency (RF) tuning circuit is located on a first side (e.g., on the TX side) of the transceiver module. The first RF tuning circuit is electrically coupled between the transceiver and the first antenna (TX). A second RF tuning circuit is located on a second side (e.g., on the RX side) of the transceiver module. The second RF tuning circuit is electrically coupled between the transceiver and the second antenna (RX). The first RF tuning circuit may be electrically coupled to a transmitter portion (e.g., power amplifier (PA) circuitry) of the transceiver and the second RF tuning circuit may be electrically coupled to a receiver portion (e.g., low noise amplifier (LNA) circuitry) of the transceiver. As can be seen in the accompanying Figures, the RF tuning circuits may be located physically close to the transceiver module. It will be appreciated that the RF tuning circuits may contain one or more capacitors (e.g., a metal insulator metal (MIM) capacitors formed in a capacitor array) and associated switching devices to allow for various impedance tuning settings.

In another aspect, a 3D inductor may be integrated into the package and electrically coupled to the transceiver and at least one of the first antenna, the second antenna, the first RF tuning circuit or the second RF tuning circuit. In one example, the 3D inductor is located between the second RF tuning circuit (RX) and the transceiver. The 3D inductor may be formed in a TMV.

Figure 1B:
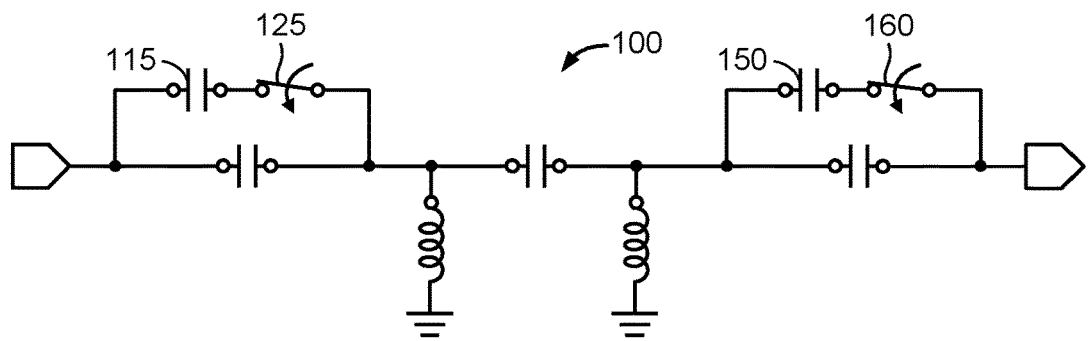
Figure 1C:
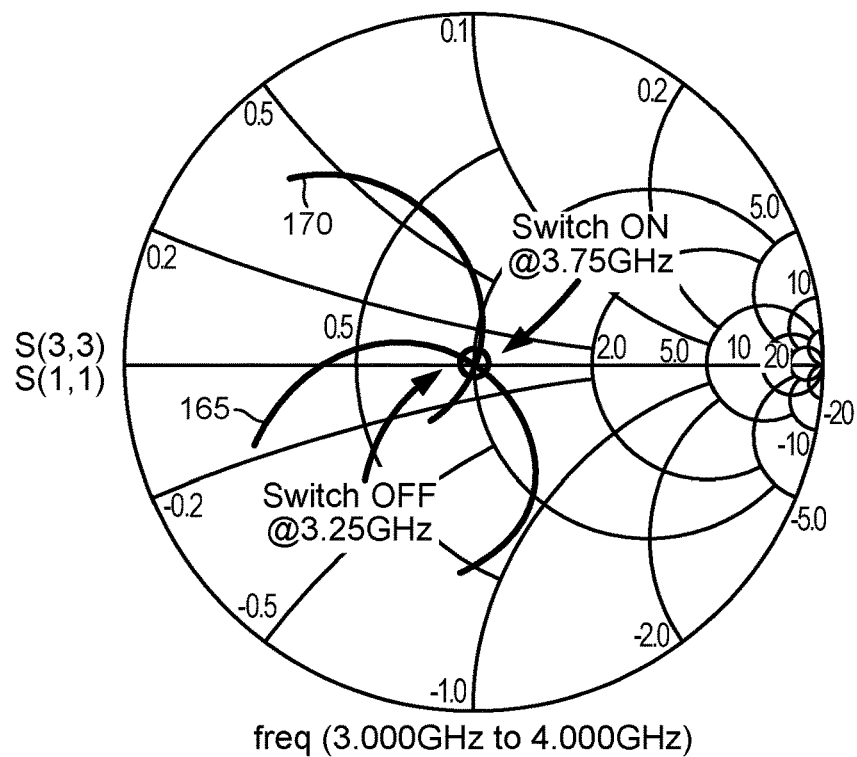

FIGS. 1A-C illustrate an exemplary tuning circuit in accordance with some examples of the disclosure. As shown in FIG. 1A, a RF tuning circuit 100 may include an input 105, an output 110, a first capacitor 115 in parallel with a second capacitor 120, a first switch 125 in series with the first capacitor 115, a first inductor 130 coupled to the first switch 125 and the second capacitor 120 and to a ground 135, a third capacitor 140, a second inductor 145 coupled to the third capacitor 140 and the ground 135, a fourth capacitor 150 in parallel with a fifth capacitor 155, and a second switch 160 in series with the fourth capacitor 150. As shown in FIG. 1A, the first switch 125 and the second switch 160 are both open. When both the first switch 125 and the second switch 160 are open, the first capacitor 115 and the fourth capacitor 150 are isolated.

As shown in FIG. 1B, the first switch 125 and the second switch 160 are both closed. When both the first switch 125 and the second switch 160 are closed, the first capacitor 115 and the fourth capacitor 150 are active and change the impedance of the tuning circuit 100. As shown in FIG. 1C, when both the first switch 125 and the second switch 160 are open (switch off), the tuning circuit 100 provides impedance matching 165 at approximately 3.25 GHz. When both the first switch 125 and the second switch 160 are closed (switch on), the tuning circuit 100 provides impedance matching 170 at approximately 3.75 GHz.

FIGS. 2A-C illustrate another exemplary tuning circuit in accordance with some examples of the disclosure. As shown in FIG. 2A, a RF tuning circuit 200 may include an input 205, an output 210, a first capacitor 215 in parallel with a second capacitor 220, a first switch 225 in series with the first capacitor 215, a first inductor 230 coupled to the first switch 225 and the second capacitor 220 and to a ground 235, a third capacitor 240, a second inductor 245 coupled to the third capacitor 240 and the ground 235, a fourth capacitor 250 in parallel with a fifth capacitor 255, and a second switch 260 in series with the fourth capacitor 250. As shown in FIG. 2A, the first switch 225 and the second switch 260 are both open. When both the first switch 225 and the second switch 260 are open, the first capacitor 215 and the fourth capacitor 250 are isolated.

As shown in table of FIG. 2B, the first switch 225 and the second switch 260 may be operated independently with both closed, both open, or one open and one closed. As shown in FIGS. 2B and 2C, when both the first switch 225 and the second switch 260 are closed (on) 270, the first capacitor 215 and the fourth capacitor 250 are active and change the impedance of the tuning circuit 200 to provide an impedance matching frequency of approximately 3.75 GHz. As shown in FIGS. 2B and 2C, when both the first switch 225 and the second switch 260 are open (off) 265, the tuning circuit 200 provides an impedance matching frequency of approximately 3.25 GHz. As shown in FIGS. 2B and 2C, when both the first switch 225 and the second switch 260 are closed (on) 270, the first capacitor 215 and the fourth capacitor 250 are active and change the impedance of the tuning circuit 200 to provide an impedance matching frequency of approximately 3.75 GHz. As shown in FIGS. 2B and 2C, when the first switch 225 is open and the second switch 260 is closed 275, the tuning circuit 200 provides an impedance matching frequency of approximately 3.40 GHz. As shown in FIGS. 2B and 2C, when the first switch 225 is closed and the second switch 260 is open 280, the tuning circuit 200 provides an impedance matching frequency of approximately 3.55 GHz.

Figure 3:
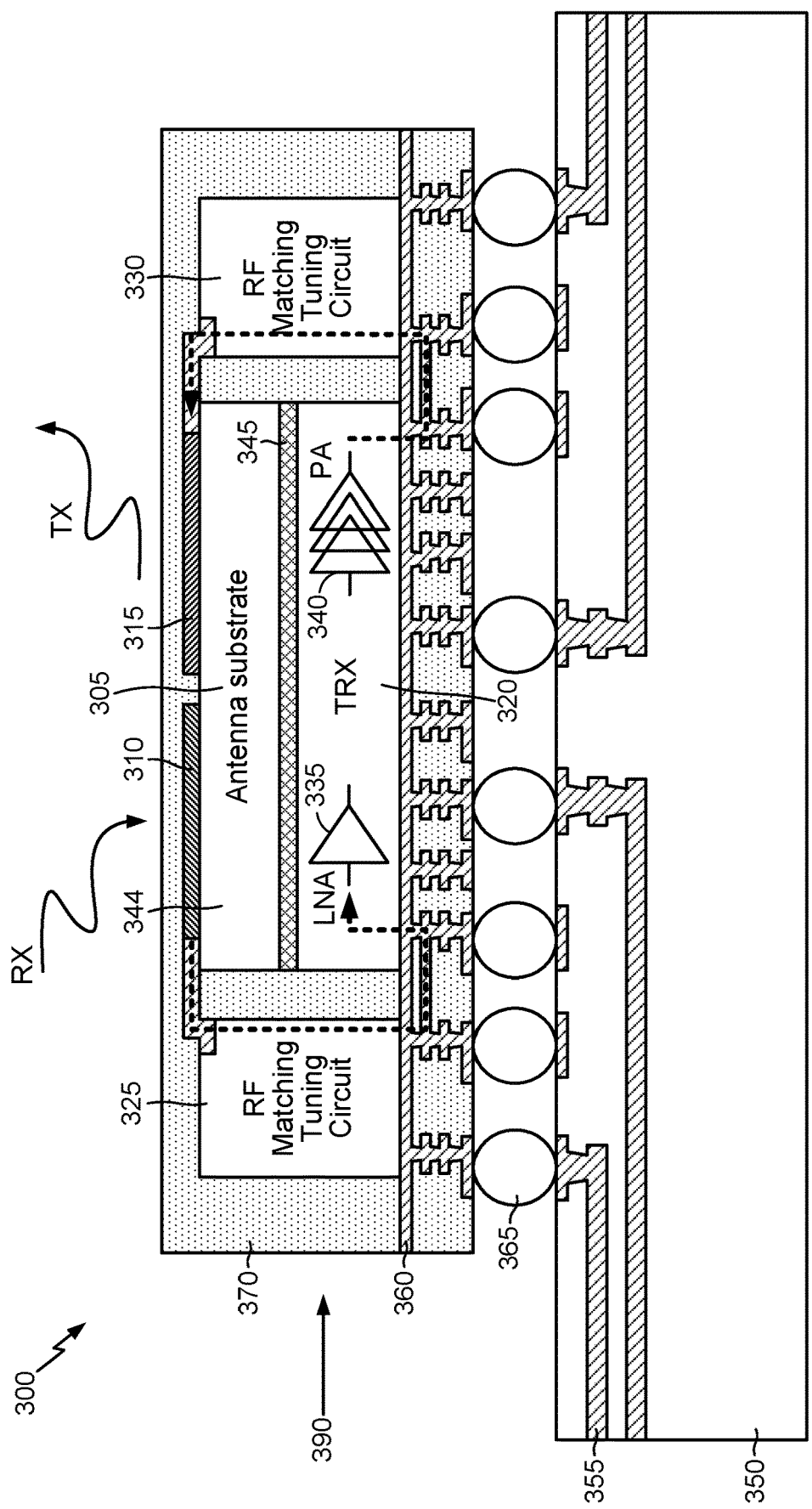
FIG. 3 illustrates an exemplary transceiver package in accordance with some examples of the disclosure.

FIG. 3 illustrates an exemplary transceiver package in accordance with some examples of the disclosure. As shown in FIG. 3, a transceiver package 300 may include transceiver module 390. The transceiver module 390 comprises an antenna substrate 305, a first antenna 310 configured to receive RF signals attached to a top surface of the antenna substrate 305, and a second antenna 315 configured to transmit RF signals attached to the top surface of the antenna substrate 305, a transceiver 320 located proximate to a bottom surface of the antenna substrate 305, a first RF tuning circuit 325 (e.g., tuning circuit 100, tuning circuit 200) on a first side of the transceiver module 390 electrically coupled between the transceiver 320 and the first antenna 310, and a second RF tuning circuit 330 on a second side of the transceiver module 390 opposite the first side and electrically coupled between the transceiver 320 and the second antenna 315. As illustrated in FIG. 3, the first RF tuning circuit 325 is also on a first side of the transceiver 320 and the second RF tuning circuit 330 on a second side of the transceiver 320 opposite the first side. The antenna substrate 305 may include a dielectric layer 344 on top of a shielding layer 345 proximate to the bottom surface of antenna substrate 305 to provide grounding or shielding of the first antenna 310 and the second antenna 315 and insulate the transceiver 320 from the antennas 310, 315. As shown, the first RF tuning circuit 325 is electrically coupled to a low noise amplifier (LNA) 335 of the transceiver 320 and the second RF tuning circuit 330 is electrically coupled to a power amplifier (PA) 340 of the transceiver 320. In addition, the RF tuning circuits 325, 330 may be located physically close to the transceiver 320, such as within 5 millimeters. As shown in FIG. 3, the transceiver package 300 may also include additional components associated with a fan-out package such as a package substrate 350 wider than the transceiver module 390 with a redistribution layer 355, a transceiver module redistribution layer 360, a plurality of solder connections 365 coupling the transceiver module 390 to the package substrate 350, and a mold compound 370 encapsulating the transceiver module 390.

Figure 4:
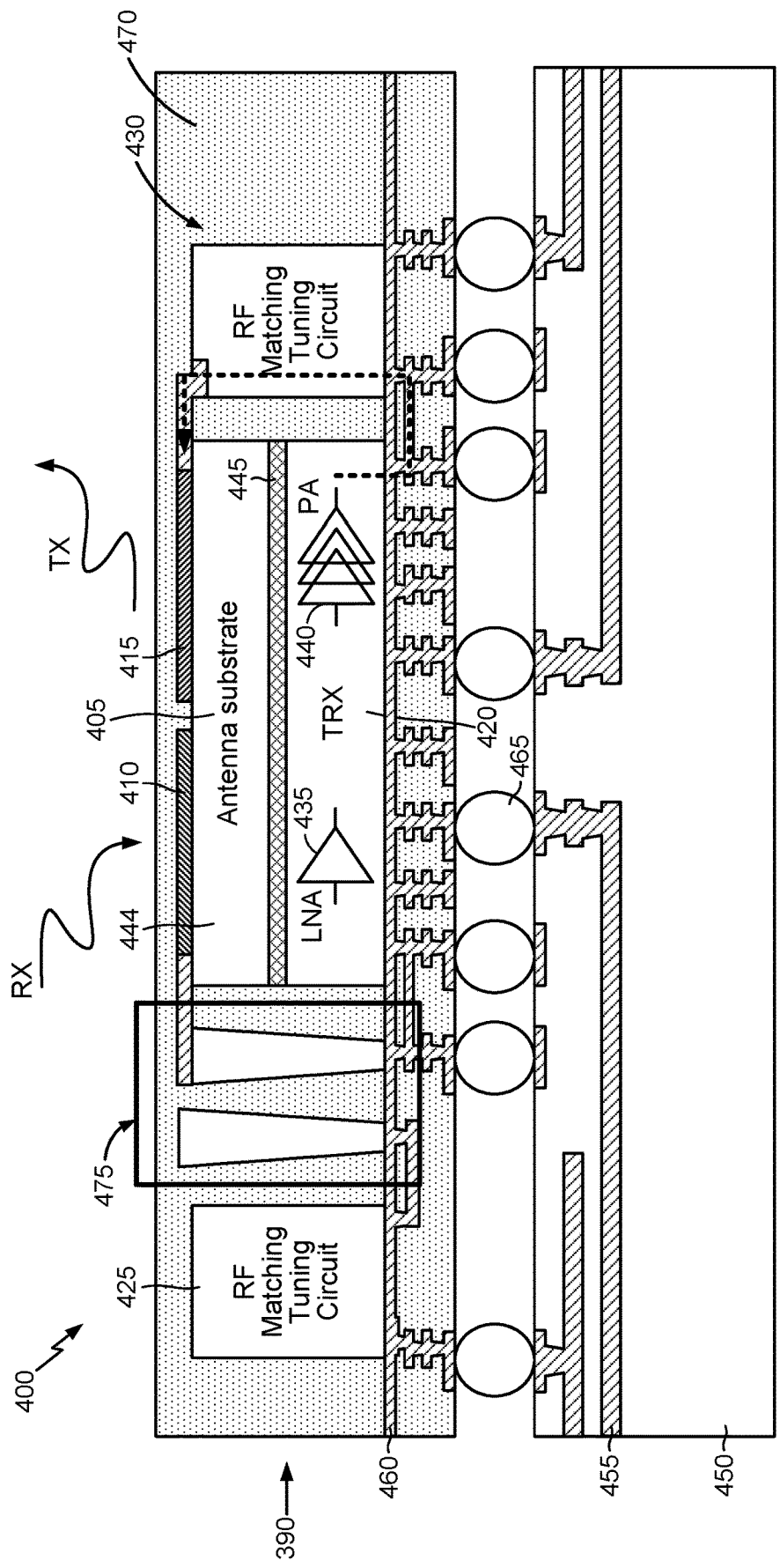
FIG. 4 illustrates another exemplary transceiver package in accordance with some examples of the disclosure.

FIG. 4 illustrates another exemplary transceiver package in accordance with some examples of the disclosure. As shown in FIG. 4, a transceiver package 400 may include transceiver module 490. The transceiver module 490 comprises an antenna substrate 405, a first antenna 410 configured to receive RF signals attached to a top surface of the antenna substrate 405, and a second antenna 415 configured to transmit RF signals attached to the top surface of the antenna substrate 405, a transceiver 420 located proximate to a bottom surface of the antenna substrate 405, a first RF tuning circuit 425 (e.g., tuning circuit 100, tuning circuit 200) on a first side of the transceiver 420 electrically coupled between the transceiver 420 and the first antenna 410, a second RF tuning circuit 430 on a second side of the transceiver 420 opposite the first side and electrically coupled between the transceiver 420 and the second antenna 415. As illustrated in FIG. 4, the first RF tuning circuit 425 is also on a first side of the transceiver 420 and the second RF tuning circuit 430 on a second side of the transceiver 420 opposite the first side. The transceiver module 490 in FIG. 4 further comprises a 3 dimensional (3D) inductor 475 electrically coupled to the transceiver 420 and at least one of the first antenna 410, the second antenna 415, the first RF tuning circuit 425, or the second RF tuning circuit 425. The 3D inductor 475 may be used in conjunction with the first RF tuning circuit 425 or the second RF tuning circuit 430 to provide impedance matching. The 3D inductor 475 may be formed from TMVs. The antenna substrate 405 may include a dielectric layer 444 on top of a shielding layer 445 proximate to the bottom surface of antenna substrate 405 to provide grounding or shielding of the first antenna 410 and the second antenna 415 and insulate the transceiver 420 from the antennas 410, 415. As shown, the first RF tuning circuit 425 is electrically coupled to a low noise amplifier (LNA) 435 of the transceiver 420 and the second RF tuning circuit 430 is electrically coupled to a power amplifier (PA) 440 of the transceiver 420. In addition, the RF tuning circuits 425, 430 may be located physically close to the transceiver 420, such as within 5 millimeters. As shown in FIG. 4, the transceiver package 400 may also include additional components associated with a fan-out package such as a package substrate 450 wider than the transceiver module 490 with a redistribution layer 455, a transceiver module redistribution layer 460, a plurality of solder connections 465 coupling the transceiver module 490 to the package substrate 450, and a mold compound 470 encapsulating the transceiver module 490. The 3D inductor 475 may be integrated into the fan-out package by a TMV formed in the mold compound 470.

Figure 5:
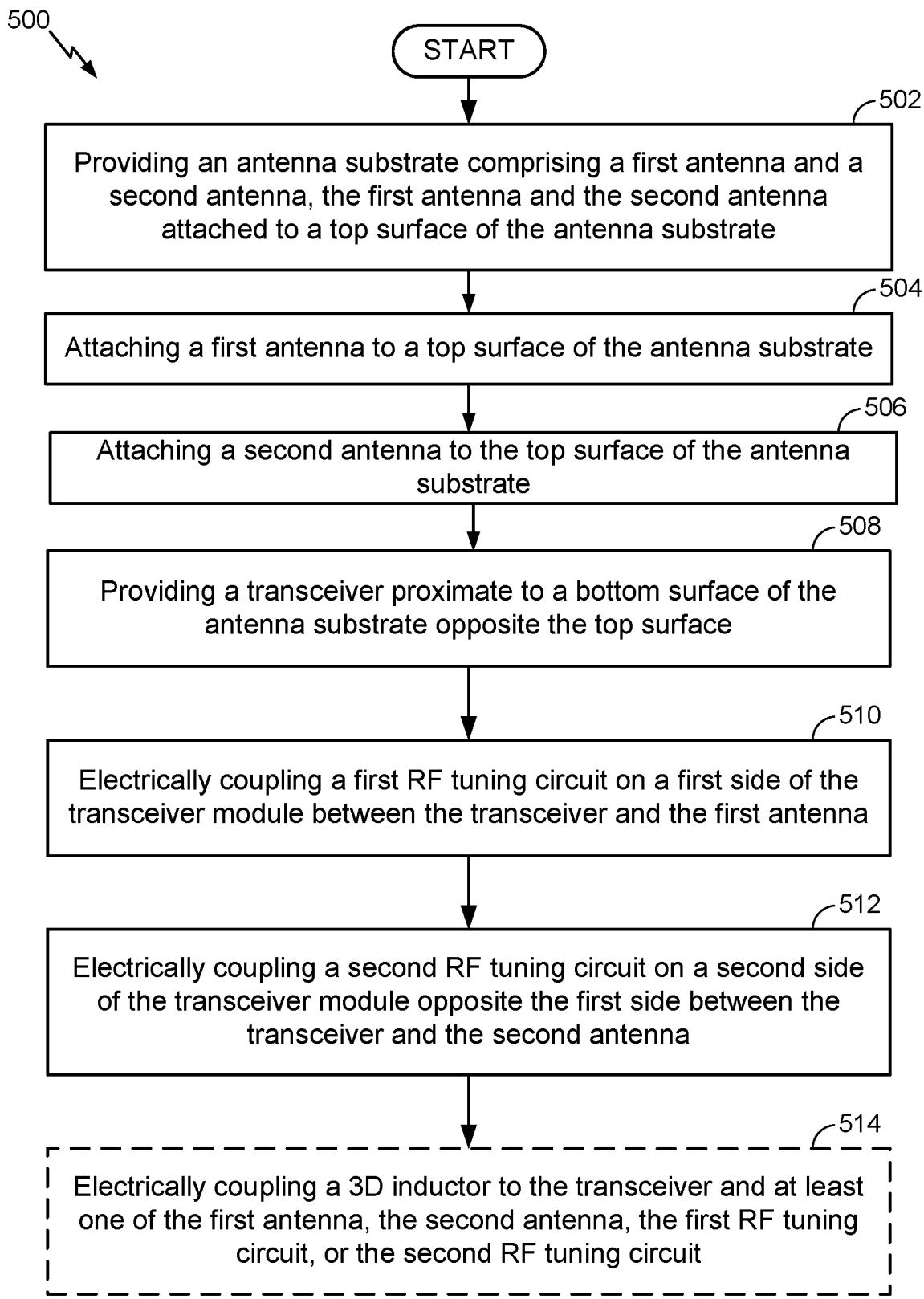
FIG. 5 illustrates an exemplary partial method for manufacturing a transceiver module in accordance with some examples of the disclosure.

FIG. 5 illustrates an exemplary partial method in accordance with some examples of the disclosure. As shown in FIG. 5, the partial method 500 for manufacturing a transceiver module may begin in block 502 with providing an antenna substrate. The partial method 500 may continue in block 504 with attaching a first antenna to a top surface of the antenna substrate. The partial method 500 may continue in block 506 with attaching a second antenna to the top surface of the antenna substrate. The partial method 500 may continue in block 508 with providing a transceiver proximate to a bottom surface of the antenna substrate opposite the top surface. The partial method 500 may continue in block 510 with electrically coupling a first RF tuning circuit on a first side of the transceiver module between the transceiver and the first antenna. The partial method 500 may conclude in block 512 with electrically coupling a second RF tuning circuit on a second side of the transceiver module opposite the first side between the transceiver and the second antenna. Alternatively, the partial method 500 may also include continue or conclude in block 516 with electrically coupling a 3D inductor to the transceiver and at least one of the first antenna, the second antenna, the first RF tuning circuit, or the second RF tuning circuit.

Figure 6:
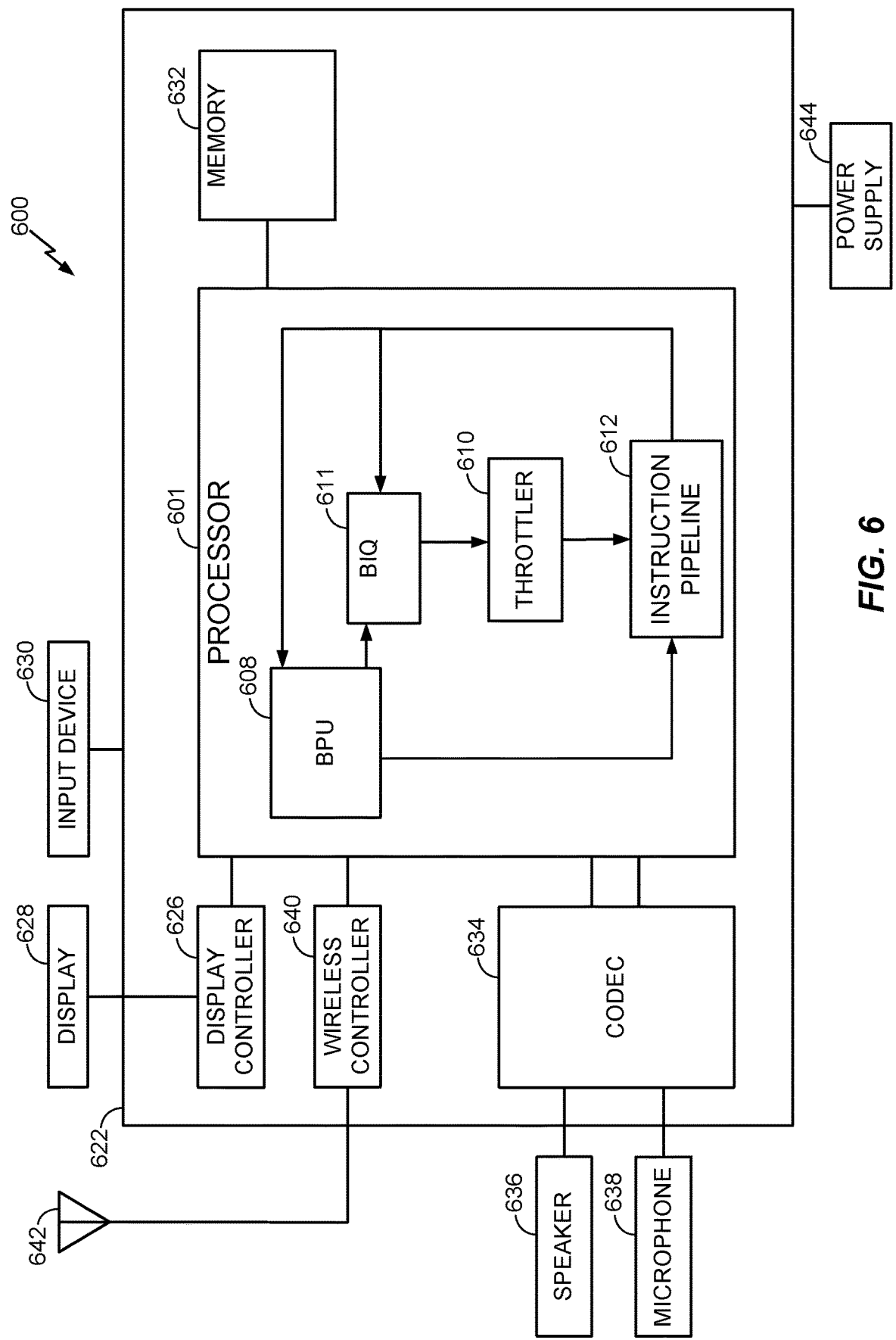
FIG. 6 illustrates an exemplary mobile device in accordance with some examples of the disclosure.

FIG. 6 illustrates an exemplary mobile device in accordance with some examples of the disclosure. Referring now to FIG. 6, a block diagram of a mobile device that is configured according to exemplary aspects is depicted and generally designated 600. In some aspects, mobile device 600 may be configured as a wireless communication device. As shown, mobile device 600 includes processor 601, which may be configured to implement the methods described herein in some aspects. Processor 601 is shown to comprise instruction pipeline 612, buffer processing unit (BPU) 608, branch instruction queue (BIQ) 611, and throttler 610 as is well known in the art. Other well-known details (e.g., counters, entries, confidence fields, weighted sum, comparator, etc.) of these blocks have been omitted from this view of processor 601 for the sake of clarity.

Processor 601 may be communicatively coupled to memory 632 over a link, which may be a die-to-die or chip-to-chip link. Mobile device 600 also include display 628 and display controller 626, with display controller 626 coupled to processor 601 and to display 628.

In some aspects, FIG. 6 may include coder/decoder (CODEC) 634 (e.g., an audio and/or voice CODEC) coupled to processor 601; speaker 636 and microphone 638 coupled to CODEC 634; and wireless controller 640 (which may include a modem) coupled to wireless antenna 642 and to processor 601. The wireless antenna 642 may comprise a transceiver package as described above.

In a particular aspect, where one or more of the above-mentioned blocks are present, processor 601, display controller 626, memory 632, CODEC 634, and wireless controller 640 can be included in a system-in-package or system-on-chip device 622. Input device 630 (e.g., physical or virtual keyboard), power supply 644 (e.g., battery), display 628, speaker 636, microphone 638, and wireless antenna 642 may be external to system-on-chip device 622 and may be coupled to a component of system-on-chip device 622, such as an interface or a controller.

It should be noted that although FIG. 6 depicts a mobile device, processor 601 and memory 632 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 7:
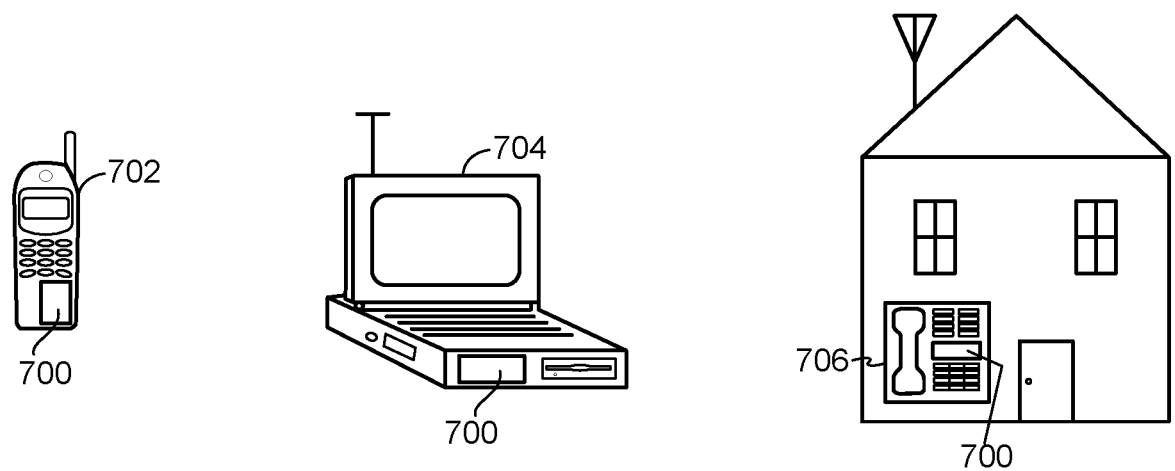
FIG. 7 illustrates various electronic devices that may be integrated with any of the aforementioned integrated device, semiconductor device, integrated circuit, die, interposer, package or package-on-package (PoP) in accordance with some examples of the disclosure.

FIG. 7 illustrates various electronic devices that may be integrated with any of the aforementioned integrated device, semiconductor device, integrated circuit, die, interposer, package or package-on-package (PoP) that may be used to realize a transceiver package or a transceiver module. In the following, they are all named integrated device 700. For example, a mobile phone device 702, a laptop computer device 704, and a fixed location terminal device 706 may include such an integrated device 700 as described herein. The integrated device 700 may be, for example, any of the integrated circuits, dies, integrated devices, integrated device packages, integrated circuit devices, device packages, integrated circuit (IC) packages, package-on-package devices described herein. The devices 702, 704, 706 illustrated in FIG. 7 are merely exemplary. Other electronic devices may also feature the integrated device 700 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

It will be appreciated that various aspects disclosed herein can be described as functional equivalents to the structures, materials and/or devices described and/or recognized by those skilled in the art. It should furthermore be noted that methods, systems, and apparatus disclosed in the description or in the claims can be implemented by a device comprising means for performing the respective actions of this method or device. For example, in one aspect, a transceiver module may comprises: an antenna substrate; a first antenna attached to a top surface of the antenna substrate; a second antenna attached to the top surface of the antenna substrate; means for transmitting and receiving radio frequency signals (e.g., a transceiver) located proximate to a bottom surface of the antenna substrate opposite the top surface; first means for tuning impedance (e.g., first RF tuning circuit) on a first side of the transceiver module, the first means for tuning impedance electrically coupled between the means for transmitting and receiving radio frequency signals and the first antenna; and second means for tuning impedance (e.g., second RF tuning circuit) on a second side of the transceiver module opposite the first side, the second means for tuning impedance electrically coupled between the means for transmitting and receiving radio frequency signals and the second antenna. It will be appreciated that the aforementioned aspects are merely provided as examples and the various aspects claimed are not limited to the specific references and/or illustrations cited as examples.

One or more of the components, processes, features, and/or functions illustrated in FIGS. 1-7 may be rearranged and/or combined into a single component, process, feature or function or incorporated in several components, processes, or functions. Additional elements, components, processes, and/or functions may also be added without departing from the disclosure. It should also be noted that FIGS. 1-7 and its corresponding description in the present disclosure is not limited to dies and/or ICs. In some implementations, FIGS. 1-7 and its corresponding description may be used to manufacture, create, provide, and/or produce integrated devices. An active side of a device, such as a die, is the part of the device that contains the active components of the device (e.g. transistors, resistors, capacitors, inductors, etc.), which perform the operation or function of the device. The backside of a device is the side of the device opposite the active side.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5 (both expressly incorporated herein in their entirety).

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples and is not intended to be limiting of examples of the disclosure. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, actions, operations, elements, and/or components, but do not preclude the presence or addition of one or more other features, integers, actions, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer or an electronic circuit. In some examples, some or a plurality of the most important method actions can be performed by such an apparatus.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim. Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A transceiver module comprising:
   an antenna substrate;
   a first antenna attached to a top surface of the antenna substrate;
   a second antenna attached to the top surface of the antenna substrate;
   a transceiver located proximate to a bottom surface of the antenna substrate opposite the top surface;
   a first RF tuning circuit on a first side of the transceiver, the first RF tuning circuit electrically coupled between the transceiver and the first antenna; and
   a second RF tuning circuit on a second side of the transceiver opposite the first side, the second RF tuning circuit electrically coupled between the transceiver and the second antenna.

2. The transceiver module of claim 1, wherein the first antenna is a transmit antenna and the second antenna is a receive antenna, and wherein the first RF tuning circuit is electrically coupled to a transmitter portion of the transceiver and the second RF tuning circuit is electrically coupled to a receiver portion of the transceiver.

3. The transceiver module of claim 1, further comprising a 3D inductor electrically coupled to the transceiver and at least one of the first antenna, the second antenna, the first RF tuning circuit, or the second RF tuning circuit.

4. The transceiver module of claim 3, wherein the 3D inductor is located between the second RF tuning circuit and the transceiver.

5. The transceiver module of claim 3, wherein the 3D inductor is formed in a through molding via in a mold compound encapsulating the transceiver module.

6. The transceiver module of claim 1, wherein the first RF tuning circuit and the second RF tuning circuit are located within 5 millimeters of the transceiver and the transceiver module is integrated into a fan-out package.

7. The transceiver module of claim 1, wherein the transceiver module is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

8. A transceiver module comprising:
an antenna substrate;
a first antenna attached to a top surface of the antenna substrate;
a second antenna attached to the top surface of the antenna substrate;
means for transmitting and receiving radio frequency signals located proximate to a bottom surface of the antenna substrate opposite the top surface;
first means for tuning impedance on a first side of the means for transmitting and receiving radio frequency signals, the first means for tuning impedance electrically coupled between the means for transmitting and receiving radio frequency signals and the first antenna; and
second means for tuning impedance on a second side of the means for transmitting and receiving radio frequency signals opposite the first side, the second means for tuning impedance electrically coupled between the means for transmitting and receiving radio frequency signals and the second antenna.

9. The transceiver module of claim 8, wherein the first antenna is a transmit antenna and the second antenna is a receive antenna, and wherein the first means for tuning impedance is electrically coupled to a transmitter portion of the means for transmitting and receiving radio frequency signals and the second means for tuning impedance is electrically coupled to a receiver portion of the means for transmitting and receiving radio frequency signals.

10. The transceiver module of claim 8, further comprising a 3D inductor electrically coupled to the means for transmitting and receiving radio frequency signals and at least one of the first antenna, the second antenna, the first means for tuning impedance, or the second means for tuning impedance.

11. The transceiver module of claim 10, wherein the 3D inductor is located between the second means for tuning impedance and the means for transmitting and receiving radio frequency signals.

12. The transceiver module of claim 10, wherein the 3D inductor is formed in a through molding via in a mold compound encapsulating the transceiver module.

13. The transceiver module of claim 8, wherein the first means for tuning impedance and the second means for tuning impedance are located within 5 millimeters of the means for transmitting and receiving radio frequency signals and the transceiver module is integrated into a fan-out package.

14. The transceiver module of claim 8, wherein the transceiver module is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

15. A method for manufacturing a transceiver module, the method comprising:
providing an antenna substrate;
attaching a first antenna to a top surface of the antenna substrate;
attaching a second antenna the top surface of the antenna substrate;
providing a transceiver proximate to a bottom surface of the antenna substrate opposite the top surface;
electrically coupling a first RF tuning circuit on a first side of the transceiver between the transceiver and the first antenna; and
electrically coupling a second RF tuning circuit on a second side of the transceiver opposite the first side between the transceiver and the second antenna.

16. The method of claim 15, wherein the first antenna is a transmit antenna and the second antenna is a receive antenna, and wherein the first RF tuning circuit is electrically coupled to a transmitter portion of the transceiver and the second RF tuning circuit is electrically coupled to a receiver portion of the transceiver.

17. The method of claim 15, wherein the method further comprises electrically coupling a 3D inductor to the transceiver and at least one of the first antenna, the second antenna, the first RF tuning circuit, or the second RF tuning circuit.

18. The method of claim 17, wherein the 3D inductor is located between the second RF tuning circuit and the transceiver.

19. The method of claim 17, wherein the 3D inductor is formed in a through molding via in a mold compound encapsulating the transceiver module.

20. The method of claim 15, wherein the first RF tuning circuit and the second RF tuning circuit are located within 5 millimeters of the transceiver and the transceiver module is integrated into a fan-out package.

* * * * *